(12) United States Patent
Xi et al.

(10) Patent No.: US 12,549,160 B2
(45) Date of Patent: Feb. 10, 2026

(54) INTEGRATED TRANSCEIVER CIRCUIT

(71) Applicant: Shenzhen Xhorse Electronics Co., Ltd., Shenzhen (CN)

(72) Inventors: Yongfeng Xi, Shenzhen (CN); Chenglong Li, Shenzhen (CN); Yuan He, Shenzhen (CN); Yijie Hao, Shenzhen (CN); Guozhong Cao, Shenzhen (CN); Xubin Zhao, Shenzhen (CN)

(73) Assignee: Shenzhen Xhorse Electronics Co., Ltd., Shenzhen (CN)

( * ) Notice: Subject to any disclaimer, the term of this patent is extended or adjusted under 35 U.S.C. 154(b) by 0 days.

(21) Appl. No.: 18/734,731

(22) Filed: Jun. 5, 2024

(65) Prior Publication Data
US 2025/0343536 A1  Nov. 6, 2025

(30) Foreign Application Priority Data
May 6, 2024 (CN) .......................... 202410554252.2

(51) Int. Cl.
*H03K 3/037* (2006.01)
*H03K 5/24* (2006.01)

(52) U.S. Cl.
CPC .............. *H03K 3/037* (2013.01); *H03K 5/24* (2013.01)

(58) Field of Classification Search
None
See application file for complete search history.

(56) References Cited

U.S. PATENT DOCUMENTS

2024/0146178 A1*  5/2024  Cho .................... H02M 1/0025

* cited by examiner

*Primary Examiner* — Cassandra F Cox
(74) *Attorney, Agent, or Firm* — Westbridge IP LLC

(57) ABSTRACT

Disclosed is an integrated transceiver circuit, which can be applied to signal transceiving between an external control device and an external diagnostic device. A communication channel between each GPIO port of the external control device and any OBD terminal is constructed by using the transmitting matrix and receiving matrix, meanwhile, a drive circuit is arranged. On the one hand, signals from external control devices are converted into an output drive signal with matchable voltage, current and load through the drive circuit and differential impedance control unit, so that signals from GPIO ports can be sent according to the voltage, current and load requirements of various communication protocols. On the other hand, signals from the OBD terminal is received according to the voltage requirements of the communication protocol through the hysteresis comparator in the drive circuit.

11 Claims, 5 Drawing Sheets

INTEGRATED TRANSCEIVER CIRCUIT

CROSS-REFERENCE TO RELATED APPLICATIONS

This application claims priority to Chinese Patent Application No. 202410554252.2, filed on May 6, 2024, the content of which is incorporated herein by reference in its entirety.

TECHNICAL FIELD

The application relates to the technical field of data communication, in particular to an integrated transceiver circuit.

BACKGROUND

Bus transceiver can realize data exchange between different types of equipment interfaces. The conventional bus transceiver integrates transceivers supporting different protocols, and uses relay switches to control the gating between the transceiver and the external On-Board Diagnostics (OBD) interface. However, this method needs relay switching and cannot be integrated on chip, thus the circuit size is large and the cost is too high. Some integrated circuits can switch certain OBD pins through the combination of transceiver and matrix switch. However, some pins are shared by multiple transceivers because of the fixed switching mode, which leads to the excessive parasitic capacitance of pins and the inability to realize high-speed bus protocols such as Controller Area Network with Flexible Data-rate (CAN FD). As a result, the chip area is large and application scenarios is limited.

SUMMARY

The application provides an integrated transceiver circuit with a small occupied space and a wide range of application scenarios.

An integrated transceiver circuit is provided, including:
a transmitting matrix;
a receiving matrix;
a buffer, used for providing a benchmark voltage;
a plurality of drive circuits, each drive circuit further includes:
a voltage regulator, used for providing a power supply voltage with adjustable voltage value; and
a driver, including a transistor (NH) and an upper transistor load regulation unit connected between a source and a drain of the transistor (NH), and a transistor (PL) and a lower transistor load regulation unit connected between a source and a drain of the transistor (PL); gates of the transistor (NH) and the transistor (PL) are respectively connected with the transmitting matrix, the source of the transistor (NH) is connected with the voltage regulator, and the source of the transistor (PL) is connected with a ground terminal; and the driver is configured to output an output drive signal with matchable voltage, current and load when being gated by the transmitting matrix;
a differential impedance control unit, including a control switch and a load element connected in series with the control switch; the control switch is used for selectively conducting a conductive path where the driver, the load element and the buffer are located, so as to maintain a reference voltage of the output drive signal at the benchmark voltage;
a hysteresis comparator, including:
a first threshold comparator, used for receiving an input drive signal from an external device and comparing a voltage of the input drive signal with a first hysteresis voltage;
a second threshold comparator, used for receiving the input drive signal and comparing the voltage of the input drive signal with a second hysteresis voltage; the first hysteresis voltage is smaller than the second hysteresis voltage;
an Reset-Set (RS) flip-flop, a reset end of the RS flip-flop is connected with an output end of the first threshold comparator, and a set end of the RS flip-flop is connected with an output end of the second threshold comparator; and
the receiving matrix is selectively connected with an output end of the RS flip-flop.

In one embodiment, the drive circuit further includes:
a first Digital-to-Analog Converter (DAC) circuit, connected to the first threshold comparator for providing the first hysteresis voltage; and
a second DAC circuit, connected to the second threshold comparator for providing the second hysteresis voltage.

In one embodiment, the drive circuit further includes:
a first voltage division circuit, connected to a bus power supply, the first DAC circuit and the second DAC circuit, and configured to divide the power supply voltage of the bus power supply to obtain a first voltage and a second voltage; the first voltage is used as the reference voltage of the first DAC circuit, and the second voltage is used as the reference voltage of the second DAC circuit.

In one embodiment, the integrated transceiver circuit further includes:
a plurality of first differential comparators, each first differential comparator is in one-to-one correspondence with each differential terminal pair of the external device, and two input ends of the first differential comparator are respectively connected with two terminals of the corresponding differential terminal pair in one-to-one correspondence; and an output end of the first differential comparator is connected with the receiving matrix.

In one embodiment, the integrated transceiver circuit further includes:
two first strobes;
a second differential comparator, two input ends of the second differential comparator are respectively connected with two output ends of the first strobe in one-to-one correspondence, and an output end of the second differential comparator is connected with the receiving matrix; and
the first strobe is use for connecting with each communication terminal of the external device and selecting one of the communication terminals to conduct with the differential comparator.

In one embodiment, a comparison threshold and output polarity of the first differential comparator and the second differential comparator are adjustable.

In one embodiment, the number of the first differential comparators is at least 4; the external device includes, but is not limited to, 4 sets of differential terminal pairs; a first differential terminal pair includes a terminal (OBD6) and a terminal (OBD14); a second differential terminal pair includes a terminal (OBD3) and a terminal (OBD11); a third differential terminal pair includes a terminal (OBD3) and a terminal (OBD8); and a fourth differential terminal pair includes a terminal (OBD12) and a terminal (OBD1).

In one embodiment, the integrated transceiver circuit further includes:

a plurality of second voltage division circuits, each second voltage division circuit corresponds to each monitoring terminal group of the external device one by one, and the second voltage division circuit is connected with each communication terminal of the corresponding monitoring terminal group for dividing voltage of a communication signal from each communication terminal;

a plurality of second strobes, each second strobe is connected with the second voltage division circuit in one-to-one correspondence, and are used for selecting at most one of the communication signal after division to output; and a plurality of buffer amplifiers, each buffer amplifier is connected with the second strobe in one-to-one correspondence, and are used for outputting the communication signal output by the second strobe.

In one embodiment, the number of the second voltage division circuits, the number of the second strobes and the number of the buffer amplifiers is at least 4, and the external device includes but is not limited to 4 sets of terminal groups to be monitored; a first terminal group to be monitored includes a terminal (OBD1), a terminal (OBD3), a terminal (OBD7) and a terminal (OBD9); a second terminal group to be monitored includes a terminal (OBD2), a terminal (OBD6), a terminal (OBD8) and a terminal (OBD10); a third terminal group to be monitored includes a terminal (OBD11), a terminal (OBD13), a terminal (OBD15) and a terminal (OBD16); and a fourth terminal group to be monitored includes a terminal (OBD14).

In one embodiment, the upper transistor load regulation unit and the lower transistor load regulation unit respectively include a plurality of parallel branches, each branch includes a switching element and a resistor element or a current mirror unit connected in series with the switching element.

In one embodiment, the drive circuit further includes:

two output configuration circuits, each output configuration circuit includes an inverter and a switching element connected in parallel between an input end and an output end of the inverter; the input end of the inverter is connected with a target transistor, and the output end of the inverter is connected with a gate of the target transistor; and the target transistor is the transistor (NH) or the transistor (PL).

A communication channel between each General Purpose Input/Output (GPIO) port of the external control device and any OBD terminal is constructed by using the transmitting matrix and receiving matrix. Meanwhile, the drive circuit is arranged at the output end of the transmitting matrix and the input end of the receiving matrix. On the one hand, signals from the external control device can be converted into an output drive signal with matchable voltage, current and load through the upper transistor drive part and the lower transistor drive part in the drive circuit, and the buffer is controlled to access the driver by the differential impedance control unit, so as to meet the reference voltage that can maintain the output drive signal when in differential input, and meet the requirements of voltage, current and load under various communication protocols. On the other hand, with the hysteresis comparator in drive circuit, signal s from the OBD terminal are received according to the protocol voltage requirements, so that the voltage is adjusted by using the drive circuit through the gating of transmitting matrix and receiving matrix, and finally the signal transmission and reception under various protocols are realized. Because the transmitting matrix and the receiving matrix are situated between the GPIO port and the drive circuit, they work in the low-voltage domain and there is no need to carry excessive current, which means that the component sizes of the transmitting matrix don't need to be very large, and there is also no need to provide too many parasitic components. The final integrated transceiver has a small area and is versatile enough to be employed in a wide range of applications.

DETAILED DESCRIPTION OF THE EMBODIMENTS

Figure 1:
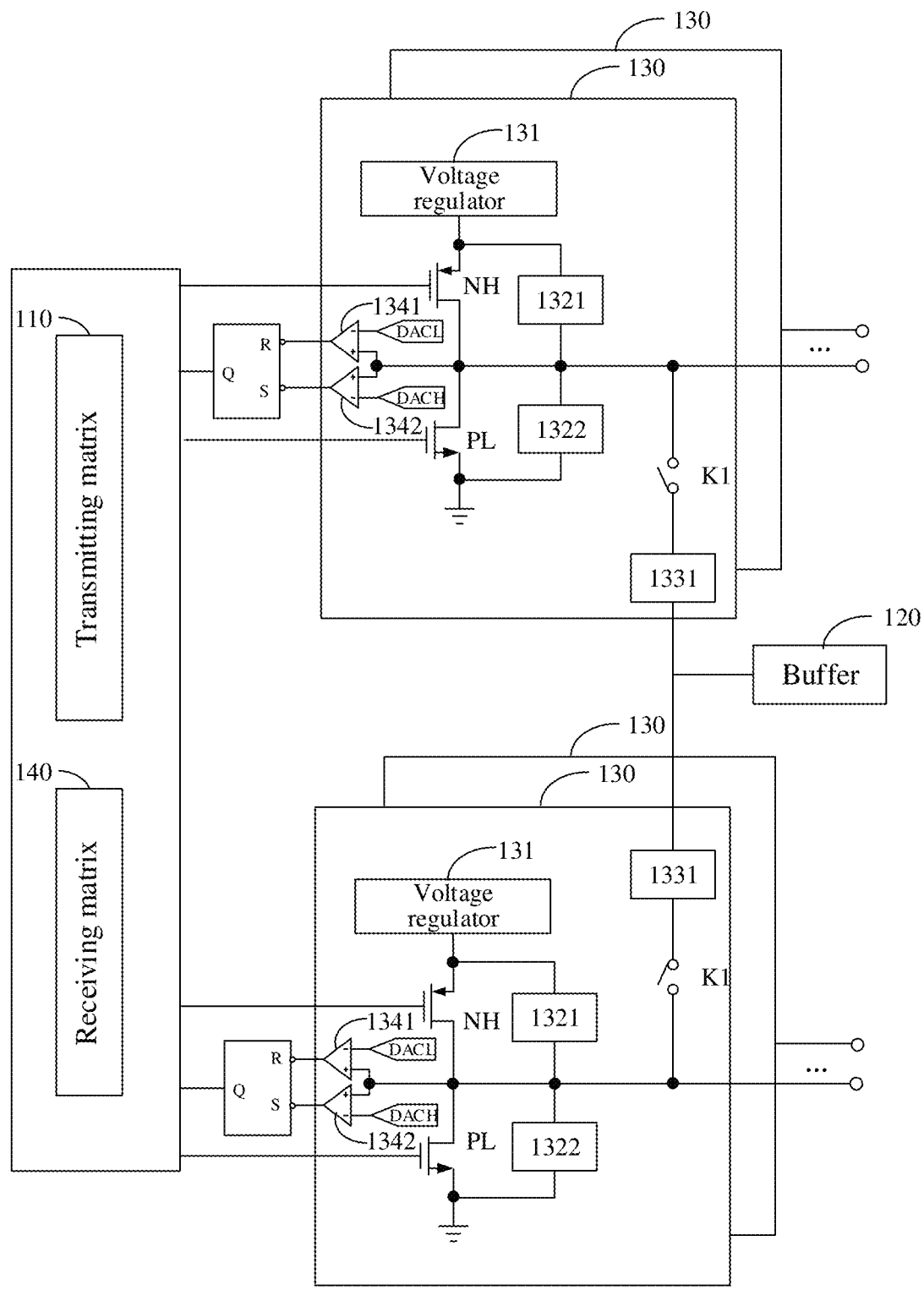
FIG. 1 is a circuit structure diagram of an integrated transceiver circuit according to an embodiment of the present application.

It should be understood that the specific embodiments described here are only used to illustrate the application, rather than to limit the application.

The technical solutions in the embodiments of the present application will be clearly and completely described below with reference to the drawings in the embodiments of this application. Obviously, the described embodiments are merely part of the embodiments of this application, not all of them. Based on the embodiments in this application, all other embodiments obtained by those of ordinary skill in the art without creative effort belong to the protection scope of this application.

It should be noted that all directional indications (such as up, down, left, right, front, back, etc.) in the embodiment of this application are merely used to illustrate the relative position relationship and movement situation of components in a certain gesture (as shown in the drawings). If the certain gesture changes, the directional indications will change accordingly. And the connection may be direct or indirect.

Furthermore, the terms "first" and "second" are used for descriptive purposes only and cannot be understood as indicating or implying relative importance or implicitly indicating the number of technical features indicated. Thus, a feature defined by "first" or "second" may explicitly or implicitly includes one or more of the features. In addition, the technical solutions of each embodiment may be combined with one another, but they must be realizable to those of ordinary skill in the art. If the combination of technical solutions is contradictory or impossible, it shall be considered that the combination of technical solutions does not exist and is not within the protection scope of this application.

FIG. 1 is an integrated transceiver circuit provided by an embodiment of the present application. As shown in FIG. 1, the integrated transceiver circuit includes a transmitting matrix 110, a buffer 120, a receiving matrix 140 and a plurality of drive circuits 130, wherein each drive circuit includes a voltage regulator 131, a driver, a differential impedance control unit and a hysteresis comparator. The voltage regulator is used to provide a power supply voltage with adjustable voltage value. The driver includes a transistor NH and an upper transistor load regulation unit 1321 connected between a source and a drain of the transistor NH, and a transistor PL and a lower transistor load regulation unit 1322 connected between a source and a drain of the transistor PL. The gates of the transistor NH and the transistor PL are respectively connected to the transmitting matrix 110, the source of the transistor NH is connected to the voltage regulator 131, and the source of the transistor PL is connected with a ground terminal. The driver is configured to output an output drive signal with matchable voltage, current and load when being gated by the transmitting matrix 110. The differential impedance control unit includes a control switch K1 and a load element 1331 connected in series with the control switch K1; the control switch is used for selectively conducting a conductive path where the driver, the load element 1331 and the buffer 120 are located, so as to maintain a reference voltage of the output drive signal at the benchmark voltage. The hysteresis comparator includes a first threshold comparator 1341, a second threshold comparator 1342 and an RS flip-flop. The first threshold comparator 1341 is used to receive an input drive signal from an external device and compare a voltage of the input drive signal with a first hysteresis voltage; the second threshold comparator 1342 is used to receive the input drive signal and compare the voltage of the input drive signal with a second hysteresis voltage. The first hysteresis voltage is less than the second hysteresis voltage. A reset end of the RS flip-flop is connected with an output end of the first threshold comparator 1341, and a set end of the RS flip-flop is connected with an output end of the second threshold comparator 1342; and the output end of RS flip-flop is connected with receiving matrix 140.

The integrated transceiver circuit of this embodiment can be applied to signal transceiving between the external control device and external diagnostic device. Specifically, the transmitting matrix 110 can construct a plurality of signal transmission channels by matching input and output ends, each input end of the transmitting matrix 110 may be used for one-to-one connection with each GPIO port of the external control circuit, and the output end of the transmitting matrix 110 is connected with each transistor one-to-one. Each input end of the transmitting matrix 110 may be connected with each output end through a switch, and any input and output end in the transmitting matrix 110 can be matched through the switching of the switch, so that the connection between each GPIO port and any transistor can be realized. Because the output of each transistor can be connected with each communication terminal of the external device (for example, each OBD terminal of the diagnostic device), any connection between each GPIO port of the external control circuit and each communication terminal of the external device can be realized.

When the external control circuit is connected with each communication terminal of the external device, in order to meet the requirement that the external control circuit transmits signals to the external device according to the expected communication protocol, the drive circuit 130 can obtain the expected voltage and current under the communication protocol according to the signals of the external control circuit, and provide a load matching with the external device, thereby realizing the signal transmission to the external device. Specifically, the voltage regulator 131, the transistor NH and the upper transistor load regulation unit 1321 in the drive circuit 130 constitute the upper transistor drive part. It can be used to obtain an output drive signal with high voltage and current values, wherein the voltage, current and load of the output drive signal are configurable because the power supply voltage of the voltage regulator 131 and the resistance value of the upper transmitter load regulation unit 1321 are adjustable. Transistor PL and lower transmitter load regulation unit 1322 constitute a lower transistor drive part for obtaining an output drive signal of 0V. The transistor NH and transistor PL adopt a push-pull output mode. Based on the upper transistor drive part and the lower transistor drive part, the driver can match the voltage, current and load of the output drive signal, thus meeting the voltage, current and load requirements under various communication protocols. In one embodiment, the voltage of the output drive signal may be configured to be 5V, 8V, 12V or 24V.

For single-wire communication protocols, such as single-wire Controller Area Network (CAN) protocol, K-LINE protocol and Variable Pulse Width (VPW) protocol, the output drive signal with specific voltage, current and load can be obtained through the upper transistor drive part or lower transistor drive part in a drive circuit 130, which can meet the voltage and current requirements under this protocol.

In order to address the signal transmission under differential communication protocols such as two-wire CAN and Recommended Standard 485 (RS485), each drive circuit 130 may also be provided with a differential impedance control unit, which is connected between the buffer 120 and the driver. During differential signal transmission, two differential signals which are different from each other can be respectively received by two drive circuits 130, and the load of the load regulating units at both ends of the transistor in the corresponding working state is adjusted to 0, so that two output drive signals can be obtained through the driving of the driver. At the same time, the control switch K1 in the differential impedance control unit is used to conduct the conductive paths where the driver, the load element 1331 and the buffer 120 are located, so that the two output drive signals are all terminated to the buffer 120, so as to maintain the reference voltage of the two output drive signals at the benchmark voltage provided by the buffer 120, reduce signal interference and improve the stability and reliability of the two output drive signals. For the connection relationship among the driver, control switch K1, load element 1331 and buffer 120, one end of the control switch K1 is connected with one end of the load element 1331. The connection relationship between the other end of the control switch K1 and the driver and the buffer 120 can be arbitrary, for example, the other end of the control switch K1 is connected with the output end of the drive, and the load element 1331 is connected with the buffer 120. Alternatively, the control switch K1 may be connected to the buffer 120, and the load element 1331 may be connected to the output end of the driver. In one embodiment, in order to realize the output of a 5V differential signal, the benchmark voltage provided by the buffer 120 may be 2.5V, and the load element 1331 may be a resistance element R1 with a resistance value of 60Ω (see FIG. 6).

Similar to the structure of the transmitting matrix 110, the receiving matrix 140 can also construct a plurality of receiving channels through the collocation of input and output ends, so as to realize the connection between each hysteresis comparator and any external GPIO port, and each hysteresis comparator is correspondingly connected with the OBD terminal of the external device. Thus the connection between any GPIO port and the OBD terminal can be established by selecting one of the communication channels.

The input drive signal is compared with the first hysteresis voltage and the second hysteresis voltage respectively by using the hysteresis comparator, and then the RS flip-flop outputs the signal of the corresponding voltage according to the comparison result. Thus the input drive signal can be transmitted under the corresponding communication protocol by setting the appropriate first hysteresis voltage and the second hysteresis voltage. In addition, because the input drive signal is compared with two hysteresis voltages respectively, and then the two comparison results are logically operated by using the RS flip-flop, the output result of the RS flip-flop remains unchanged when the voltage of the input drive signal is between the first hysteresis voltage and the second hysteresis voltage, thereby improving the accuracy and reliability of the output signal.

According to the requirements of the communication protocol, the first hysteresis voltage and the second hysteresis voltage may be configured as expected values. In one embodiment, the first hysteresis voltage and the second hysteresis voltage may be directly provided by an external power supply or generated by an internal circuit.

The integrated transceiver circuit adopts the transmitting matrix 110 and receiving matrix 140 to construct the communication channel between each GPIO port of the external control device and any OBD terminal. Meanwhile, the drive circuit 130 is arranged at the output end of the transmitting matrix 110 and the input end of the receiving matrix 140. On the one hand, signals from the external control device can be converted into an output drive signal with matchable voltage, current and load through the upper transistor drive part and the lower transistor drive part in the drive circuit 130, and the buffer 120 is controlled to access the driver by the differential impedance control unit, so as to meet the reference voltage that can maintain the output drive signal when in differential input, and meet the requirements of voltage, current and load under various communication protocols. On the other hand, with the hysteresis comparator in drive circuit, signal s from the OBD terminal are received according to the protocol voltage requirements, so that the voltage is adjusted by using the drive circuit 130 through the gating of transmitting matrix 110 and receiving matrix 140, and finally the signal transmission and reception under various protocols is realized. Because the transmitting matrix 110 and the receiving matrix 140 are situated between the GPIO port and the drive circuit 130, they work in the low-voltage domain and there is no need to carry excessive current, which means that the component sizes of the transmitting matrix 110 don't need to be very large, and there is also no need to provide too many parasitic components. The final integrated transceiver has a small area and is versatile enough to be employed in a wide range of applications.

In one embodiment, the number of drive circuits 130 may be 13, which are respectively connected to 13 OBD terminals of diagnostic device.

In one embodiment, the drive circuit 130 further includes a first DAC circuit and a second DAC circuit (not shown). The first DAC circuit is connected with the first threshold comparator 1341 for providing a first hysteresis voltage; the second DAC circuit is connected with the second threshold comparator 1342 for providing a second hysteresis voltage.

The DAC circuit may be a digital-to-analog converter. It can be understood that the first hysteresis voltage and the second hysteresis voltage may be generated by two DAC circuits respectively. Because the voltage output by the DAC circuit has a specific proportional relationship with its reference voltage, the desired hysteresis voltage can be obtained by adjusting the size of the reference voltage provided to the DAC circuit.

Therefore, using DAC circuit to generate hysteresis voltage is simple, and based on the relationship between the output voltage of DAC circuit and reference voltage, it is convenient to adjust the magnitude of hysteresis voltage.

In one embodiment, the drive circuit 130 further includes a first voltage division circuit (not shown), which is connected with the bus power supply, the first DAC circuit and the second DAC circuit respectively, and can be configured to divide the power supply voltage of the bus power supply to obtain a first voltage and a second voltage; the first voltage is used as the reference voltage of the first DAC circuit, and the second voltage is used as the reference voltage of the second DAC circuit.

It can be understood that the reference voltage of DAC circuit can be obtained by dividing the external bus power supply with the first voltage division circuit. The voltage division ratio of the first voltage division circuit is configurable, thus the reference voltage of the DAC circuit is configurable. In one embodiment, the first voltage division circuit may include an adjustable load, and a specific voltage may be obtained by adjusting the resistance of the load connected to the conductive path. In one embodiment, the first voltage and the second voltage are equal to 0.2 times the power supply voltage. In this way, the first voltage division circuit is used to divide the external bus power supply, and there is no need to set a separate power supply inside, saving space and cost.

Figure 2:
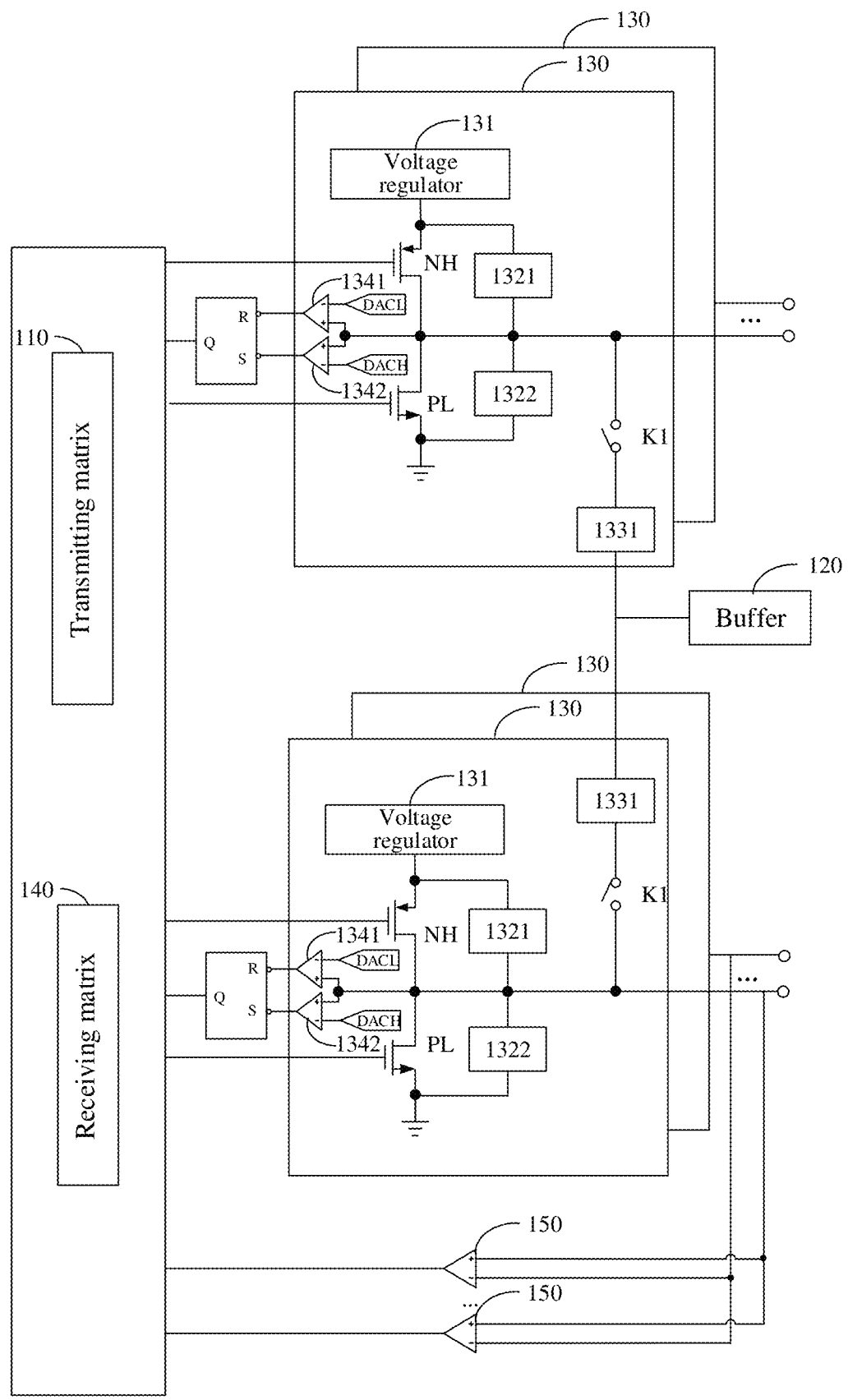
FIG. 2 is a circuit structure diagram of an integrated transceiver circuit according to another embodiment of the present application.

In one embodiment, as shown in FIG. 2, the integrated transceiver circuit further includes a plurality of first differential comparators 150, each of which corresponds to each differential terminal pair of the external device in one-to-one correspondence, and two input ends of the first differential comparators 150 are respectively connected to two terminals in the corresponding differential terminal pair in one-to-one correspondence; and an output end of each first differential comparator 150 is connected to the receiving matrix 140.

It can be understood that the above-mentioned hysteresis comparator can be used to realize the reception under the single-wire communication protocol, while the differential comparator can be used to realize the reception of differential signals under the two-wire communication protocol. Specifically, the differential terminal pair of the external device maybe two terminals for outputting two differential signals which are different from each other among the terminals of the external device, and the same number of first differential comparators 150 may be arranged for multiple sets of differential terminal pairs of the external device to be connected with each differential terminal pair in one-to-one correspondence. The two input ends of the first differential comparator 150 are respectively connected with the two differential terminals of the corresponding differential terminal pair, and the comparison result of the corresponding voltage value can be output by comparing the voltage difference of the two differential signals with the comparison threshold.

Figure 3:
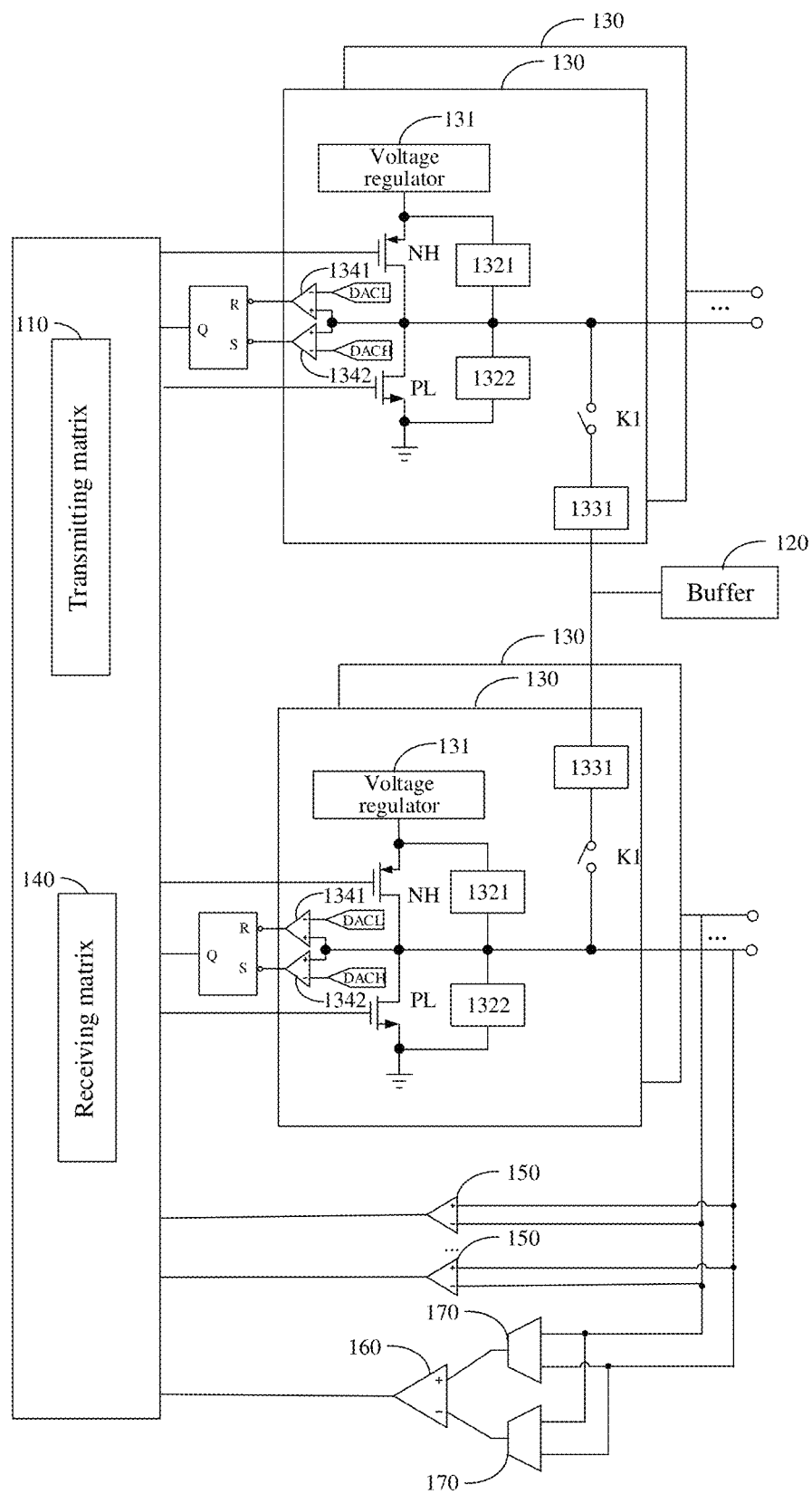
FIG. 3 is a circuit structure diagram of an integrated transceiver circuit according to another embodiment of the present application.

In one embodiment, as shown in FIG. 3, the integrated transceiver circuit further includes: two first strobes 170 and a second differential comparator 160. Two input ends of the second differential comparator 160 are respectively connected with the output ends of two first strobe 170 in one-to-one correspondence, and the output ends of the second differential comparator 160 are connected with the receiving matrix 140. The first strobe 170 is used to connect with each communication terminal of the external device, and is used to select one of the communication terminals to conduct with the differential comparator.

It can be understood that the first differential comparator 150 is connected with the differential terminal pair defined by the external device at the factory. Considering that the external device may use other terminals to output differential signals, it can be realized by setting two first strobes 170 and second differential comparator 160. Specifically, two first strobes 170 may be provided with a plurality of connection terminals respectively to connect with communication terminals of the external device. During signal transmission, the first strobe 170 can select one of the communication terminals to be connected with the second differential comparator 160, so that two ports of the differential signal to be output can be selected by using the two first strobes 170 to be connected with the second differential comparator 160, thereby receiving the differential signal output by any communication terminal.

In one embodiment, the comparison threshold and output polarity of the first differential comparator 150 are adjustable.

It can be understood that the comparison threshold of the first differential comparator 150 can be adjusted, so that the comparison results output by the first differential comparator 150 can be matched accordingly.

The output end of the first differential comparator 150 may be provided with an inverter and a switch, and the switch is connected in parallel with the input and output ends of the inverter, so as to selectively connect the inverter to the output end of the first differential comparator 150, thereby realizing the adjustment of the polarity of the output signal.

In one embodiment, the comparison threshold and output polarity of the second differential comparator 160 are adjustable.

Similar to the first differential comparator 150, the comparison results output by the second differential comparator 160 can be matched by adjusting the comparison threshold.

The output end of the second differential comparator 160 may be provided with an inverter and a switch, and the switch is connected in parallel with the input and output ends of the inverter, so as to selectively connect the inverter to the output end of the second differential comparator 160, thereby realizing the adjustment of the polarity of the output signal.

In one embodiment, the number of the first differential comparators 150 is at least 4; the external device includes, but is not limited to, 4 sets of differential terminal pairs; a first differential terminal pair includes a terminal OBD6 and a terminal OBD14; a second differential terminal pair includes a terminal OBD3 and a terminal OBD11; a third differential terminal pair includes a terminal OBD3 and a terminal OBD8; and a fourth differential terminal pair includes a terminal OBD12 and a terminal OBD1.

It can be understood that the external device may be a vehicle-mounted self-diagnosis system, and usually terminals OBD6 and OBD14, OBD3 and OBD11, OBD3 and OBD8, OBD12 and OBD1 are default differential terminal pairs for outputting two differential signals, so the number of first differential comparators 150 may be at least 4 for data transmission, so as to be correspondingly connected to each differential terminal pair. For the signal receiving process under the differential communication protocol, taking the differential terminal pair of terminal OBD6 and terminal OBD14 as an example. Assuming that the terminal OBD6 is high side drive, the output voltage is 5V, and a differential impedance of 60Ω is connected through the control switch in the drive circuit, and conducted with the buffer, so that the terminal OBD6 can be switched to the Controller Area Network high (CANH) function in the differential pair. Assuming that the terminal OBD14 is low side drive, the output voltage is 5V, a differential impedance of 60Ω is connected through the control switch in the drive circuit, and conducted with the buffer, so that the terminal OBD14 can be switched to the Controller Area Network low (CANL) function in the differential pair. The process of receiving signals from other differential terminal pairs is similar.

Figure 4:
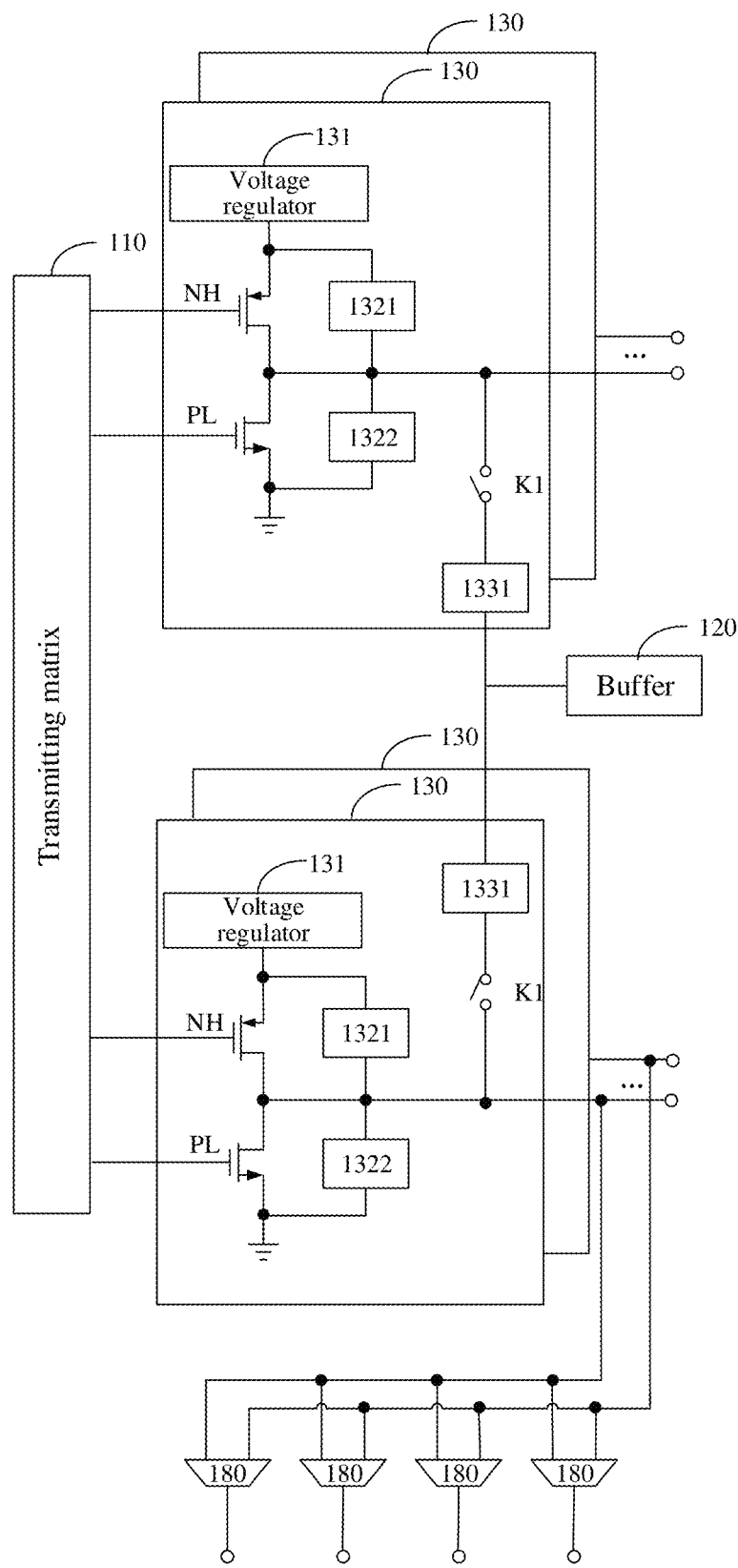
FIG. 4 is a circuit structure diagram of an integrated transceiver circuit according to another embodiment of the present application.

In one embodiment, as shown in FIG. 4, the integrated transceiver circuit further includes a plurality of second voltage division circuits (not shown), a plurality of second strobes 180 and a plurality of buffer amplifiers (not shown); each second voltage division circuit is connected with each monitoring terminal group of the external device in one-to-one correspondence; the second voltage division circuit is connected with each communication terminal of the corresponding monitoring terminal group and used for dividing voltage for the communication signal from each communication terminal. Each second strobe 180 is connected with each second voltage division circuit in one-to-one correspondence, and is used for selecting at most one of the communication signals after division for output; each buffer amplifier is connected with each second strobe 180 in one-to-one correspondence, and is used for outputting the communication signal output by the second strobe 180.

Each monitoring terminal group may be a group of communication terminals with voltage to be monitored of the external diagnostic device. In order to monitor the output state of each monitoring terminal group, the corresponding second voltage division circuit is adopted to divide voltage of the communication signal to reduce the voltage of the communication signal, and then the divided communication signal is transmitted to the corresponding second strobe 180. In this way, according to the monitoring needs, one of the communication signals at the OBD end is selected for output, and then output through the buffer amplifier to match the input impedance and reduce the signal distortion, and finally transmitted to the Auxiliary (AUX) pin of the integrated transceiver circuit for output.

In one embodiment, the voltage division ratio of the second voltage division circuit may be 0.2.

In one embodiment, the number of second voltage division circuits, second strobes 180, and buffer amplifiers is at least 4. The external device includes but is not limited to to 4 sets of terminal groups to be monitored; a first terminal group to be monitored includes a terminal OBD1, a terminal OBD3, a terminal OBD7 and a terminal OBD9; a second terminal group to be monitored includes a terminal OBD2, a terminal OBD6, a terminal OBD8 and a terminal OBD10; a third terminal group to be monitored includes a terminal OBD11, a terminal OBD13, a terminal OBD15 and a terminal OBD16; and a fourth terminal group to be monitored includes a terminal OBD14.

It can be understood that the external device may be a vehicle-mounted self-diagnosis system. Generally, the terminal OBD1, terminal OBD3, terminal OBD7 and terminal OBD9 are defined as a terminal group to be monitored; the terminal OBD2, terminal OBD6, terminal OBD8 and terminal OBD10 are defined as a terminal group to be monitored; the terminal OBD11, terminal OBD13, terminal OBD15 and terminal OBD16 are defined as a terminal group to be monitored; the terminal OBD14 is defined as a terminal group to be monitored. Therefore, in order to facilitate monitoring, the number of second voltage division circuits, second strobes 180 and buffer amplifiers may be at least 4, so that each terminal group to be monitored can be monitored correspondingly, thus the voltage monitoring for any OBD terminal can be realized. In one embodiment, the pin voltage of any OBD terminal can be read by this monitoring mode, and then the pin protocol type can be judged according to the pin voltage. For example, if the pin voltage of the terminal OBD6 is detected to be 2.5V, it is judged that it is a CAN protocol.

Figure 5:
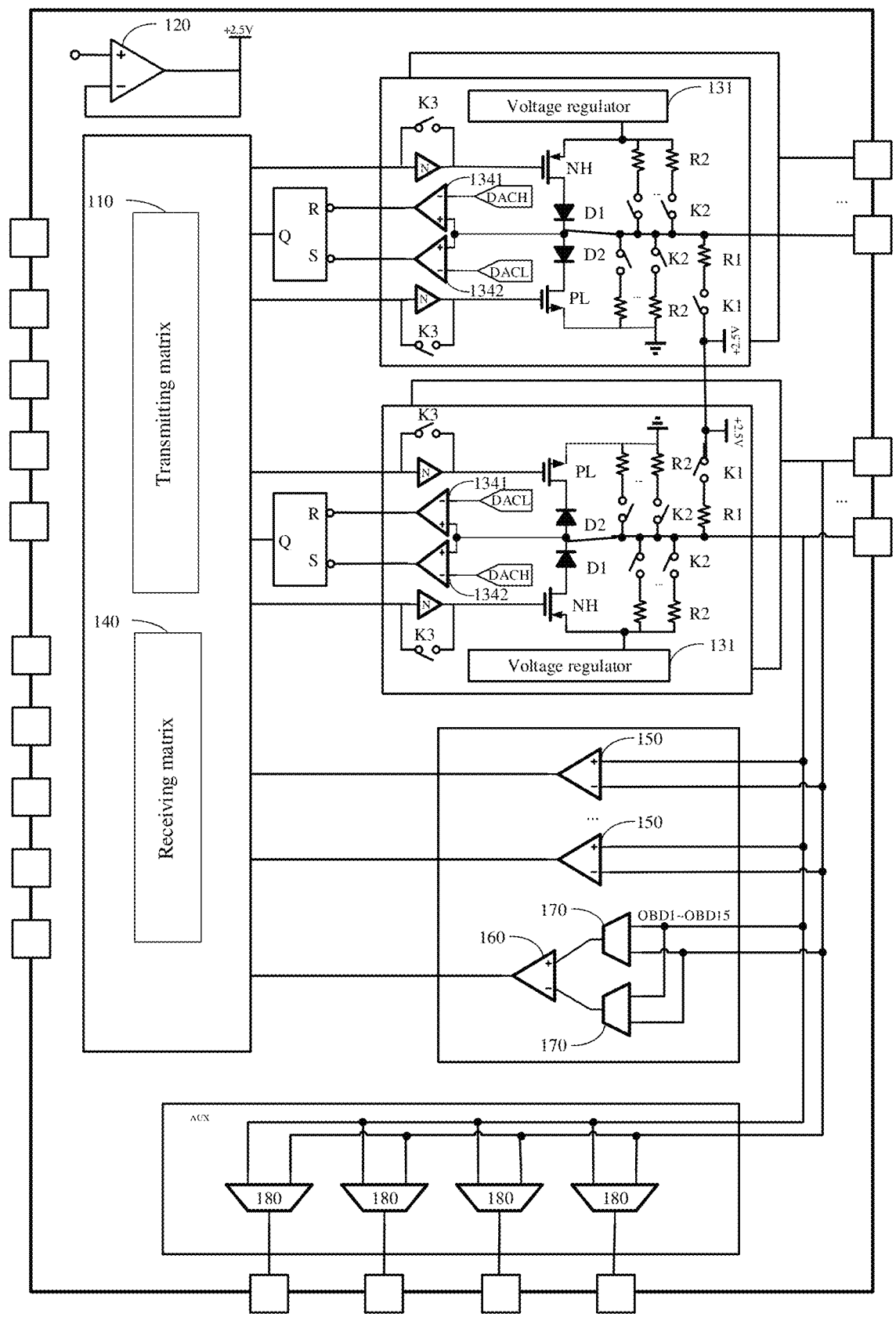
FIG. 5 is a circuit structure diagram of an integrated transceiver circuit according to another embodiment of the present application.

In one embodiment, as shown in FIG. 5, the upper transistor load regulation unit 1321 and the lower transistor load regulation unit 1322 respectively include a plurality of parallel branches, wherein each branch includes a switching element K2 and a resistor element R2 or a current mirror unit (not shown) connected in series with the switching element K2.

It can be understood that the upper transistor load regulation unit 1321 is used to clamp the output drive signal at a high level, and the lower transistor load regulation unit 1322 is used to clamp the output drive signal at a low level. The upper transistor load regulation unit 1321 and lower transistor load regulation unit 1322 may include a plurality of parallel branches, and each branch may include a switching element and a resistance element connected in series with each other, or a switching element and a current mirror unit connected in series with each other. The switching element is used to control the turn-on of the resistance element or the current mirror unit, thus realizing the voltage, current and load configuration of the output drive signal.

In one embodiment, the resistance values of each resistive element R2 may be the same or different. In one embodiment, the current provided by each current mirror unit may be the same or different.

In one embodiment, the driver may further include a diode D1 and a diode D2, as shown in FIG. 6, which are respectively arranged at the output ends of the transistor NH and the transistor PL to limit the current flow direction and ensure the normal operation of the transistor.

In one embodiment, the drive circuit 130 further includes two output configuration circuits, each of which includes an inverter N and a switching element connected in parallel between the input end and the output end of the inverter N; wherein the input end of the inverter N is connected with the target transistor, and the output end of the inverter N is connected with the gate of the target transistor; and the target transistor is the transistor NH or the transistor PL.

It can be understood that the signal from the external device may be high potential indicating explicit state or low potential indicating explicit state. In order to drive the transistor, an output configuration circuit may be arranged at the gate of each transistor, thus changing the polarity of the signal transmitted to the transistor by the external device. Specifically, the output configuration circuit may include an inverter N and a switching element K3 connected in parallel at both ends of the inverter N. The switching element K3 may selectively connect the inverter N between the transmitting matrix 110 and the transistor, thereby selectively changing the polarity of the signal output by the transmitting matrix 110 to effectively drive the transistor. For example, the signal output by the transmitting matrix 110 is at a low level, but the transistor NH needs to be driven at a high level. In this case, the switch can be turned off, so that the signal becomes high level through inverter N and is further transmitted to transistor NH.

The embodiment of the application also provides an integrated transceiver circuit, as shown in FIG. 6, it includes a transmitting matrix 110, a receiving matrix 140, a buffer 120, a plurality of drive circuits 130, a plurality of first differential comparators 150, two first strobes 170, a second differential comparator 160, a plurality of second voltage division circuits, a plurality of second strobes 180 and a plurality of buffer amplifiers. Each drive circuit 130 includes a voltage regulator 131, a driver, a differential impedance control unit, a hysteresis comparator, a first DAC circuit, a second DAC circuit, a first voltage division circuit and two output configuration circuits.

For signal transmission mode, the driver includes a transistor NH, an upper transistor load regulation unit 1321 connected between the source and the drain of the transistor NH, a transistor PL, a lower transistor load regulation unit 1322 connected between the source and the drain of the transistor PL, a diode D1 connected to the drain of the transistor NH and a diode D2 connected to the drain of the transistor PL. The voltage regulator 131 is used to output the power supply voltage to the source of the transistor NH and the upper transistor load regulation unit 1321. The source of the transistor PL is connected to the ground terminal. Thus, the driver may be configured to output the output drive signal with a matchable voltage when gated by the transmitting matrix 110. The gates of the transistor NH and the transistor PL may also be connected with the output configuration circuit respectively. The output configuration circuit includes an inverter N and a switching element connected in parallel between the input end and the output end of the inverter N. In this way, the inverter N may be configured between the transmitting matrix 110 and the transistor through the switching element, so as to be suitable for the input modes of both explicit input and implicit input.

The differential impedance control unit includes a control switch K1 and a load element 1331 connected in series with the control switch K1. By using the control switch K1, the conductive path where the driver, load element 1331 and buffer 120 are located can be selectively conducted to maintain the reference voltage of the output drive signal at the benchmark voltage.

For signal receiving mode, the hysteresis comparator includes a first threshold comparator 1341, a second threshold comparator 1342 and an RS flip-flop. The first voltage division circuit may be configured to divide the power supply voltage of the bus power supply. The first voltage obtained by voltage division is used as the reference voltage of the first DAC circuit, and the second voltage obtained by voltage division is used as the reference voltage of the second DAC circuit, so that the first DAC circuit provides the first hysteresis voltage to the first threshold comparator 1341, and the second DAC circuit provides the second hysteresis voltage to the second threshold comparator 1342. The first threshold comparator 1341 and second threshold comparator 1342 respectively receive the output drive signal and compare the voltage of the output drive signal with the corresponding hysteresis voltage, wherein the first hysteresis voltage is smaller than the second hysteresis voltage. The comparison result of the first threshold comparator 1341 is output to the reset end of the RS flip-flop, the comparison result of the second threshold comparator 1342 is output to the set end of the RS flip-flop, and the output result of the RS flip-flop is output to the receiving matrix 140. In this way, the receiving matrix 140 transmits it to the corresponding port of the external control device, so that when the voltage of the input drive signal is between the first hysteresis voltage and second hysteresis voltage, the output result of the RS flip-flop remains unchanged, thereby improving the accuracy and reliability of the output signal.

Each first differential comparator 150 is in one-to-one correspondence with each differential terminal pair of the external device, and two input ends of the first differential comparator 150 are respectively connected with two terminals of the corresponding differential terminal pair. The output end of each first differential comparator 150 is connected to the receiving matrix 140, so as to receive the differential signal from the defined differential terminal pair.

Two input ends of the second differential comparator 160 are respectively connected with the output ends of two first strobes 170 in one-to-one correspondence, and the output end of the second differential comparator 160 is connected with the receiving matrix 140. The first strobe 170 is used to connect with each communication terminal of the external device. In this way, the two first strobes 170 may respectively select one of the communication terminals to conduct with the second differential comparator 160, so as to receive the differential signal from the undefined terminal pair.

The comparison threshold and output polarity of the first differential comparator 150 and the second differential comparator 160 are configurable, so that the voltage adjustment of any input drive signal and the adjustment of driving polarity can be realized.

In addition, the cooperation among the plurality of second voltage division circuits, the plurality of second strobes 180 and the plurality of buffer amplifiers can realize the output monitoring of the OBD terminal. Each second voltage division circuit corresponds to each monitoring terminal group of the external device one by one, and the second voltage division circuit is connected with each communication terminal of the corresponding monitoring terminal group for dividing voltage of the communication signal from each communication terminal. Each second strobe 180 is connected to each second voltage division circuit in one-to-one correspondence, and is used to select at most one of the communication signals after division for output. Finally, the communication signal output by the second strobe 180 is amplified by the buffer amplifier, so that the external monitoring device can judge the output state of the OBD terminal based on the amplified signal.

The above are merely the preferred embodiments of this application, and are not intended to limit the application. Any equivalent structure or process transformation made by using the contents of this application specification and drawings, or directly or indirectly used in other related technical fields, shall be included in the patent protection scope of this application.

What is claimed is:

1. An integrated transceiver circuit, comprising:
a transmitting matrix;
a receiving matrix;
a buffer, used for providing a benchmark voltage;
a plurality of drive circuits, wherein each drive circuit comprises:
a voltage regulator, used for providing a power supply voltage with adjustable voltage value; and
a driver, comprising a transistor (NH) and an upper transistor load regulation unit connected between a source and a drain of the transistor (NH), and a transistor (PL) and a lower transistor load regulation unit connected between a source and a drain of the transistor (PL); wherein gates of the transistor (NH) and the transistor (PL) are respectively connected with the transmitting matrix, the source of the transistor (NH) is connected with the voltage regulator, and the source of the transistor (PL) is connected with a ground terminal; and the driver is configured to output an output drive signal with matchable voltage, current and load when being gated by the transmitting matrix;
a differential impedance control unit, comprising a control switch and a load element connected in series with the control switch; wherein the control switch is used for selectively conducting a conductive path where the driver, the load element and the buffer are located, so as to maintain a reference voltage of the output drive signal at the benchmark voltage;
a hysteresis comparator, comprising:
a first threshold comparator, used for receiving an input drive signal from an external device and comparing a voltage of the input drive signal with a first hysteresis voltage;
a second threshold comparator, used for receiving the input drive signal and comparing the voltage of the input drive signal with a second hysteresis voltage; wherein the first hysteresis voltage is smaller than the second hysteresis voltage; and
an Reset-Set (RS) flip-flop, wherein a reset end of the RS flip-flop is connected with an output end of the first threshold comparator, and a set end of the RS flip-flop is connected with an output end of the second threshold comparator; the receiving matrix is selectively connected with an output end of the RS flip-flop.

2. The integrated transceiver circuit of claim 1, wherein the drive circuit further comprises:
a first Digital-to-Analog Converter (DAC) circuit, connected to the first threshold comparator for providing the first hysteresis voltage; and
a second DAC circuit, connected to the second threshold comparator for providing the second hysteresis voltage.

3. The integrated transceiver circuit of claim 2, wherein the drive circuit further comprises:
a first voltage division circuit, connected to a bus power supply, the first DAC circuit and the second DAC circuit, and configured to divide the power supply voltage of the bus power supply to obtain a first voltage and a second voltage; wherein the first voltage is used as the reference voltage of the first DAC circuit, and the second voltage is used as the reference voltage of the second DAC circuit.

4. The integrated transceiver circuit of claim 1, wherein the integrated transceiver circuit further comprises:
a plurality of first differential comparators, wherein each first differential comparator is in one-to-one correspondence with a differential terminal pair of the external device, and two input ends of the first differential comparator are respectively connected with two terminals of the corresponding differential terminal pair in one-to-one correspondence; and an output end of the first differential comparator is connected with the receiving matrix.

5. The integrated transceiver circuit of claim 4, wherein the integrated transceiver circuit further comprises:
two first strobes; and
a second differential comparator, wherein two input ends of the second differential comparator are respectively connected with two output ends of the first strobe in one-to-one correspondence, and an output end of the second differential comparator is connected with the receiving matrix;
wherein the first strobe is used for connecting with each communication terminal of the external device and selecting one of the communication terminals to conduct with the differential comparator.

6. The integrated transceiver circuit of claim 5, wherein a comparison threshold and output polarity of the first differential comparator and the second differential comparator are adjustable.

7. The integrated transceiver circuit of claim 4, wherein the number of the first differential comparators is at least 4; the external device comprises, but is not limited to, 4 sets of differential terminal pairs; a first differential terminal pair comprises a terminal (OBD6) and a terminal (OBD14); a second differential terminal pair comprises a terminal (OBD3) and a terminal (OBD11); a third differential terminal pair comprises a terminal (OBD3) and a terminal (OBD8); and a fourth differential terminal pair comprises a terminal (OBD12) and a terminal (OBD1).

8. The integrated transceiver circuit of claim 1, wherein the integrated transceiver circuit further comprises:
- a plurality of second voltage division circuits, wherein each second voltage division circuit corresponds to a monitoring terminal group of the external device one by one, and the second voltage division circuit is connected with each communication terminal of the corresponding monitoring terminal group for dividing voltage of a communication signal from each communication terminal;
- a plurality of second strobes, wherein each second strobe is connected with the second voltage division circuit in one-to-one correspondence, and are used for selecting at most one of the communication signal after division to output; and
- a plurality of buffer amplifiers, wherein each buffer amplifier is connected with the second strobe in one-to-one correspondence, and are used for outputting the communication signal output by the second strobe.

9. The integrated transceiver circuit of claim 8, wherein the number of the second voltage division circuits, the number of the second strobes and the number of the buffer amplifiers are at least 4, and the external device comprises but is not limited to 4 sets of terminal groups to be monitored; a first terminal group to be monitored comprises a terminal (OBD1), a terminal (OBD3), a terminal (OBD7) and a terminal (OBD9); a second terminal group to be monitored comprises a terminal (OBD2), a terminal (OBD6), a terminal (OBD8) and a terminal (OBD10); a third terminal group to be monitored comprises a terminal (OBD11), a terminal (OBD13), a terminal (OBD15) and a terminal (OBD16); and a fourth terminal group to be monitored comprises a terminal (OBD14).

10. The integrated transceiver circuit of claim 1, wherein the upper transistor load regulation unit and the lower transistor load regulation unit respectively comprise a plurality of parallel branches, each branch comprises a switching element and a resistor element or a current mirror unit connected in series with the switching element.

11. The integrated transceiver circuit of claim 1, wherein the drive circuit further comprises:
- two output configuration circuits, wherein each output configuration circuit comprises an inverter and a switching element connected in parallel between an input end and an output end of the inverter; the input end of the inverter is connected with a target transistor, and the output end of the inverter is connected with a gate of the target transistor; and the target transistor is the transistor (NH) or the transistor (PL).

\* \* \* \* \*